United States Patent [19]

Schnegg et al.

[11] Patent Number: 4,971,654

[45] Date of Patent: Nov. 20, 1990

[54] PROCESS AND APPARATUS FOR ETCHING SEMICONDUCTOR SURFACES

[75] Inventors: Anton Schnegg, Burghausen; Gerhard Brehm, Emmerting; Helene Prigge, Unterschleissheim; Robert Rurländer, Halsbach; Fritz Ketterl, Munich, all of Fed. Rep. of Germany

[73] Assignee: Wacker-Chemitronic Gesellschaft fur Electronik-Grundstoffe mbH, Burghausen, Fed. Rep. of Germany

[21] Appl. No.: 229,262

[22] Filed: Aug. 8, 1988

[30] Foreign Application Priority Data

Aug. 27, 1987 [DE] Fed. Rep. of Germany ....... 3728693

[51] Int. Cl.$^5$ .......................................... H01L 21/306
[52] U.S. Cl. .................................. 156/638; 156/662; 156/642; 252/79.2; 252/79.3
[58] Field of Search ............... 156/635, 638, 642, 662; 252/79.2, 79.3

[56] References Cited

U.S. PATENT DOCUMENTS

| | | | |
|---|---|---|---|
| 2,890,044 | 6/1959 | Hays | 156/642 |
| 3,839,534 | 10/1974 | Matsumoto | 156/642 |
| 3,951,710 | 4/1976 | Basi | 156/642 |
| 4,526,650 | 7/1985 | Blomquist | 156/642 |
| 4,530,735 | 7/1985 | Whitehurst et al. | 156/642 |
| 4,540,465 | 9/1985 | Coggins et al. | 156/642 |
| 4,572,824 | 2/1986 | Kim | 156/642 |
| 4,601,780 | 7/1986 | Coggins et al. | 156/642 |
| 4,673,521 | 6/1987 | Sullivan et al. | 156/642 |
| 4,747,907 | 5/1988 | Acocella et al. | 156/642 |
| 4,806,192 | 2/1989 | Haas | 156/642 |
| 4,826,605 | 5/1989 | Doble et al. | 156/642 |

FOREIGN PATENT DOCUMENTS

| | | | |
|---|---|---|---|
| 0019475 | 2/1983 | Japan | 156/642 |
| 0222583 | 12/1984 | Japan | 156/642 |
| 0033368 | 2/1985 | Japan | 156/642 |

Primary Examiner—David Simmons
Assistant Examiner—Lori-Ann Johnson
Attorney, Agent, or Firm—Collard, Roe & Galgano

[57] ABSTRACT

A process and apparatus for etching semiconductor surfaces, in particular, silicon, with a mixture containing nitrogen-oxygen based compounds as oxidizing compounds, hydrofluoric acid as the component which dissolves the oxidation product, and sulfuric acid, optionally with phosphoric acid added, as a carrier medium. This mixture makes it possible to design the process as a cyclic process in which oxygen supplied to the system ultimately effects an oxidation of the material to be etched, and the product of its oxidation is removed from the circuit. The process is noteworthy for its low usage of reagents and because it is not harmful to the environment.

9 Claims, 2 Drawing Sheets

PROCESS AND APPARATUS FOR ETCHING SEMICONDUCTOR SURFACES

BACKGROUND OF THE INVENTION

1. The Field of the Invention

This invention relates to an assembly for etching semiconductor surfaces by the combined action of agents which oxidize the semiconductor material and which dissolve the oxidation product, and also to an apparatus for carrying out the process.

2. Description of the Prior Art

It is known that surfaces of elementary semiconductors such as silicon or germanium are treated by means of etching solutions in which an oxidizing agent and an agent which dissolves the oxidation product produced in the process always act together. Examples of such etching solutions are mixtures containing, for example, nitric acid, dichromate or permanganate as oxidizing agents, and hydrofluoric acid as the agent which ultimately dissolves the oxidation product, for example, silicon or germanium oxide. These known etching solutions frequently also contain diluents such as water, acetic acid, glycerine, phosphoric acid or according to Austrian Patent Specification No. 377,868, sulfuric acid. In this patent, numerous further common etching solutions are also discussed.

However, with these known etching solutions, the action decreases to an increasingly considerable extent as the duration of use increases. Thus, these solutions have to be checked frequently to even guarantee reproducible results of the etching process. This results, on the one hand, in a considerable requirement for unused starting materials to replace used components, and on the other hand, these quantities of used etching mixtures have to be disposed of and this may cause environmental pollution.

SUMMARY OF THE INVENTION

It is an object of the inVention to provide an environmentally harmless process which avoids the disadvantages mentioned above and makes it possible to etch silicon or germanium surfaces with low etching mixture consumption.

It is another object of the invention to provide an etching process in which the dissolving agent is again liberated from the reaction product produced in the dissolution of the oxidation product.

It is an additional object of the invention to provide an etching process in which the reduction products formed in the oxidation are reoxidized by means of oxygen and form agents which oxidize the semiconductor material.

Accordingly, these objects are achieved by a process in which the agents are circulated in a sulfuric acid or phosphoric acid carrier medium and in which:

(a) the reduction products formed in the oxidation are reoxidized by means of oxygen to form agents which oxidize the semiconductor material;

(b) the dissolving agent is again liberated from the reaction product produced in the dissolution of the oxidation product; and (c) the agents are again transferred to the carrier medium and again caused to act on the semiconductor surfaces while the solid residues formed are separated off and removed from the circuit.

As a rule, sulfuric acid is used as the carrier medium in which the agents having a chemical oxidizing or dissolving action in the actual etching process are supplied. In particular, commercially available concentrated sulfuric acid, i.e., at least 95% by weight, has proven successful in this process, although it is also possible, in principle, to use acids with a higher proportion of water. Often a proportion of up to about 90% by weight, ideally 20–80% by weight, of phosphoric acid, based on the sulfuric acid, is added. Depending on the required water content, either phosphorus oxide (usually $P_4O_{10}$) or else phosphoric acid is introduced into the sulfuric acid in this process. Experience shows that such mixtures yield a particularly mirror like wafer surface.

The use of carrier media very rich in phosphoric acid, including complete replacement of the sulfuric acid by phosphoric acid, is also possible. For purposes of simplification, only sulfuric acid will be discussed below as the carrier medium, although the facts mentioned can also be extrapolated analogously to the sulfuric acid/phosphoric acid mixtures mentioned.

Ideally, agents based on nitrogen-oxygen compounds are used as oxidizing agents which incipiently oxidize the semiconductor material to be treated and consequently make the erosive attack by the second component of the etchant possible. A particularly simple possibility is provided by the use of nitric acid which is beneficially used in concentrated form, i.e., with a proportion of $HNO_3$ of at least about 65% by weight. Another variant used, particularly if etching mixtures containing a low proportion of water are required, comprises adding gaseous nitric oxides or salts of nitric or nitrous acid, such as nitrates or nitrites of potassium or sodium, to the carrier medium. At the same time, however, the risk of possible contamination of the semiconductor material with the cations present has to be taken into consideration. In addition to the nitrogen-oxygen based agents, which are particularly preferred because of the easy reoxidation of the reduction products formed in the etching process, other redox systems such as those based on chromate or manganate or alternatively, permanganate, can conceivably also be used. However, with these systems, the reoxidation is more expensive.

Hydrofluoric acid is primarily suitable as the medium which dissolves the oxidation product produced during the oxidative attack on the semiconductor surface and from which the reaction product so obtained is again released. It is usually used as an aqueous solution, beneficially in concentrated form, i.e., as an at least 40% solution by weight. Low-water etching mixtures can be prepared if fluorides such as sodium, potassium or ammonium fluoride, from which the hydrofluoric acid is then released, are added to the sulfuric acid carrier medium. Other possibilities comprise, for example, injecting gaseous hydrogen fluoride or adding the usually 70% by weight, liquid ("polymeric") hydrogen fluoride.

These and other objects and advantages of the present invention will become apparent from the following description of the accompanying drawings, which discloses an embodiment of the present invention. It is to be understood that the drawings are to be used for the purpose of illustration only, and not as a definition of the invention.

BRIEF DESCRIPTION OF THE DRAWINGS

In the drawings, where similar reference numerals denote similar elements throughout.

DESCRIPTION OF THE PREFERRED EMBODIMENT

Figure 1:
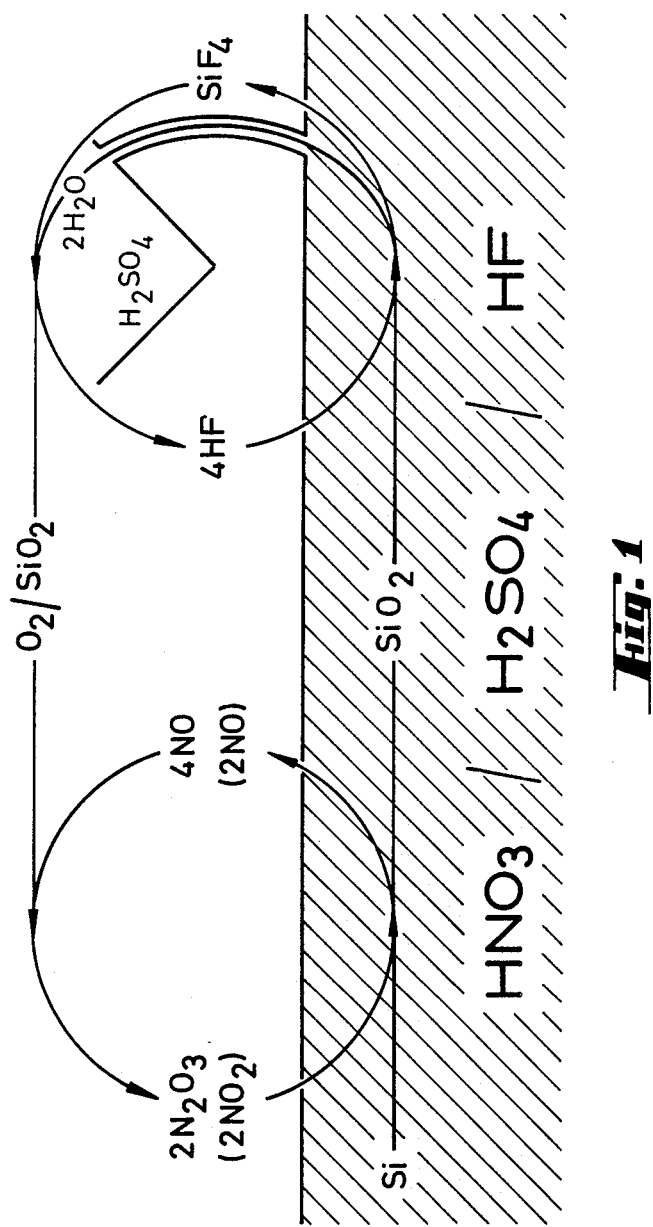
FIG. 1 is a schematic illustration of the cyclic etching process of the present invention.

Referring to FIG. 1, there is shown, as an example, the carrier medium sulfuric acid which contains nitric acid in solution to form the first subcycle and, in addition, hydrofluoric acid to form the second subcycle. If elementary silicon, for example, in the form of wafers or slices, is brought into contact with this liquid phase such as by immersion or spraying, then theoretically the following redox processes essentially proceed in the liquid system:

$$4HNO_3 + Si \rightarrow 4NO_2 + 2H_2O + SiO_2 \quad \text{I}$$

$$2NO_2 + 2H_2SO_4 \rightarrow NO^+HSO_4^- + NO_2^+HSO_4^- + H_2O \quad \text{II}$$

$$4NO^+HSO_4^- + Si + 2H_2O \rightarrow SiO_2 + 4NO + 4H_2SO_4 \quad \text{III}$$

$$4NO_2^+HSO_4^- + 3Si + 2H_2O \rightarrow 3SiO_2 + 4NO + 4H_2SO_4 \quad \text{IV}$$

The reduction product NO which is produced escapes from the liquid phase and may be oxidized by the oxygen contained in the gas phase according to:

$$2NO + O_2 \rightarrow 2NO_2 (+2H_2SO_4 \rightarrow \text{see reaction II}) \quad \text{V}$$

or $$2NO + \tfrac{3}{2}O_2 \rightarrow N_2O_3 (+2H_2SO_4 \rightarrow 2NO^+HSO_4^- + H_2O) \quad \text{VI}$$

to form compounds which are absorbed by the sulfuric acid phase and are thus able to again oxidize elementary silicon to silicon dioxide, for example, by reaction III or IV while undergoing reduction themselves. Consequently, in this subcycle, elementary silicon is ultimately converted into its oxide by means of atmospheric oxygen.

In the second subcycle, the silicon dioxide formed is subjected to the action of the hydrofluoric acid dissolved in the sulfuric acid and this can proceed in accordance with:

$$SiO_2 + 4HF \rightarrow SiF_4 + 2H_2O \quad \text{VII}$$

or $$SiO_2 + 6HF \rightarrow H_2SiF_6 + 2H_2O \rightleftharpoons SiF_4 + 2HF + 2H_2O \quad \text{VIII}$$

with the formation of volatile silicon tetrafluoride. The latter may finally be hydrolyzed in the presence of water in accordance with:

$$SiF_4 + 2H_2O \rightarrow SiO_2 + 4HF \quad \text{IX}$$

the hydrogen fluoride formed being returned again to the sulfuric acid in order to dissolve further silicon dioxide from the oxidation cycle. At the same time, the silicon dioxide produced in the hydrolysis step is separated, for example, by filtering and removed from the cycle.

If, as is usually the case, the individual substeps of the cyclic processes are not carried out in a single-pot process but at different stations, the use of different temperatures has been successful. The actual etching process, corresponding to the sets of subreactions I to IV and also VII and VIII, is expediently carried out at its own etching station. This station, for example, may be an immersion bath or a spray etching chamber and a temperature of 20 to 50° C., preferably 30 to 45° C., is ideally maintained. On the other hand, experience has shown that the hydrolysis step in aqueous sulfuric acid corresponding to reaction IX requires higher temperatures. At the hydrolysis station, temperatures of 90 to 200° C., preferably 120 to 180° C., are therefore expediently established. If low-water acid mixtures are used, even higher temperatures may be used.

The reoxidation of the oxidizing agent used up in the etching process takes place in the regeneration zone according to reactions V and VI. In this process, gaseous HF can additionally be returned from reaction IX to the carrier medium, with a temperature of 5 to 50° C., in particularly 10 to 30° C., being beneficially maintained.

Figure 2:
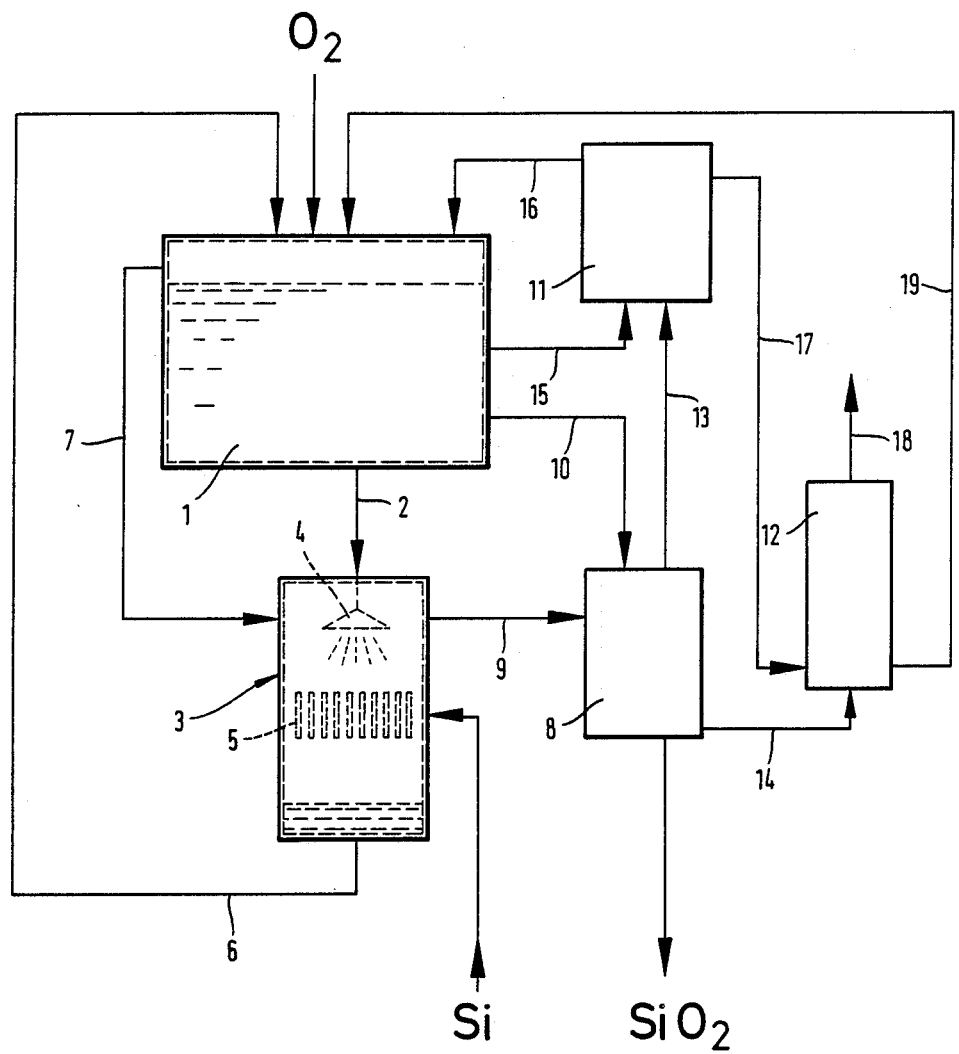
FIG. 2 is a schematic illustration of the apparatus used to perform the process shown in FIG. 1.

Referring to FIG. 2, there is shown the construction of a possible apparatus suitable for carrying out the process. In describing this figure, the process as such is also explained in more detail by way of example.

The particular etchant selected, for example, a mixture containing hydrofluoric acid, nitric acid, sulfuric acid and water in the mole ratio of about 1 : 1.5 : 3 : 8 is provided in an etchant reservoir 1. The mixing ratio established in a particular case can vary within wide limits. Thus, good etching results are achieved both with mixtures with low water content (say, a mixing ratio of approximately 1 : 1.6 : 6.2 : 6.1) and also with a high water content (mixing ratio of approximately 1 : 1.6 : 6.3 : 11.8). Optimally, etchant reservoir 1 is kept at a temperature of 30 to 40° C., for example, by a thermostat.

The mixture is fed, via an etchant supply line 2, to the etching station 3, which could be a spray etching chamber, for example. In the spray etching mixture chamber, the etchant mixture is directed by means of spray nozzles 4 onto the substrates provided, for example, semiconductor wafers 5 consisting of silicon or germanium. Wafers 5 can be inserted or removed by means of a loading and removal device (not shown) which could be in the form of an insertion and removal isolating chamber. It has also been shown to be worthwhile to provide facilities for supplying gas at the etching station in order to reoxidize a part of the oxidizing agent used up even at this point in the process. This is done by supplying oxygen or oxygen-containing gas mixtures such as air, or for example, to establish a inert atmosphere for the termination of the etching process by means of inert gases. The etching mixture collecting in etching station 3 after acting on wafers 5 is fed back again into the etchant reservoir via etchant return line 6 by pumping, for example.

In addition to the components not used up, the returned etchant also contains the reaction products transferred into the solution during the etching process. Expediently, an oxygen-containing atmosphere such as air can also be provided in etchant reservoir 1 via a gas inlet in order to make a partial reoxidation of the nitrogen-oxygen compounds reduced in the etching process possible even at this point. The gas mixture produced here may be fed into the etching station as a carrier gas via supply line 7.

The working up of the spent etchant mixture is beneficially carried out in two subsections, the hydrolysis step and the regeneration step. Hydrolysis station 8 expediently has two supply line possibilities 9 and 10 which permit the supply of the gases collecting in the etching station 3 or etchant from the etchant reservoir 1. Optionally, it is also possible to have preheating equipment for the gas and, in particular, for the liquid to be connected in these supply lines. In the hydrolysis station itself, the usually water-rich acid mixture provided in each case is adjusted to a temperature of preferably 120 to 180° C., for example, by means of heat exchangers with steam flowing through them or by electrical heating elements. Under these conditions, the $SiF_4$ formed in the etching process reacts with the water present in accordance with equation IX to be reconverted into hydrogen fluoride and $SiO_2$. This $SiO_2$ produced may, for example, be separated off from the liquid phase by filtering or centrifuging, and removed. The $SiO_2$ can be used, for example, to check the etching rates since the proportion of silicon contained therein essentially corresponds to the quantity of elementary silicon etched away during the etching process.

Because of its low solubility in the hot sulfuric acid media, the hydrogen fluoride produced in the hydrolysis reaction occurs mainly in the gas phase which also contains nitrogen oxides and oxygen or air. In the regeneration zone, the gases present in the ga phase and required for the etching process are optionally also oxidized and reconverted to the dissolved state so that the solution can subsequently be fed back into the etchant reservoir for renewed use in the cycle.

Expediently, the regeneration zone or region is subdivided into several, as a rule, two, regenerating stations 11 and 12 which are each connected to the hydrolysis station via supply lines 13 and 14. Although such a subdivision is not essential, it is generally more effective than arrangements with a single regeneration station.

Regeneration station 11, which may be designed in the form of an absorber column, for example, is in this case supplied with etching mixture from etchant reservoir 1 via a supply line 15. There the gases, which essentially contain hydrogen fluoride, nitrogen oxides and small proportions of air or oxygen, are fed from hydrolysis station 8 via supply line 13 and flow through the etching mixture. Optionally, supply line 13 may incorporate a filter. Expediently, the liquid phase present is kept at a temperature below 50° C. in order to ensure an adequate absorption of the gases, particularly of hydrogen fluoride. The etching solution enriched to such an extent can be added again to the etchant stock present in etchant reservoir 1 via return line 16, either continuously or in batches.

The gas phase left behind can be transferred into second regeneration station 12 via discharge line 17 into which an exhaust line (not shown) from the etchant reservoir 1 may optionally debouch. Second regeneration station 12 is simultaneously loaded with etching mixture originating from hydrolysis station 8 and freed of $SiO_2$ via supply line 14. The still gaseous residual proportions of hydrogen fluoride and nitrogen oxides left behind are absorbed by the etching mixture so that eventually essentially only the oxygen or the oxygen-containing gas mixture, in particular air not used up, is left behind in the gas phase. This gas mixture can be discharged from the system via outlet 18, usually after passing through a filter which retains any troublesome residues still present. The enriched etchant left behind is finally introduced into the etchant reservoir again via return line 19. Expediently, regeneration station 12 is also designed as an absorber column in which, for example, an intimate contact between the liquid and the gas phases is provided by counter-current flow.

In many cases, it has proved worthwhile not to allow the etch cycle (via lines 2 and 6) and the working-up cycle to run in parallel, but to etch alternately with the etching mixture. The etching process is interrupted after the etching rate has dropped below a certain limit value determined, in general, in preliminary experiments and then the working-up of the etchant is initiated in the hydrolysis station and regeneration station. The etching process can then subsequently be continued. An advantageous refinement of the inventive idea comprises incorporating two or more etching stations in the system which can then be loaded or discharged alternately while the etching process proceeds in parallel therewith.

To prevent any escape of the gases produced during the process, it has proved worthwhile to operate the etching plants at a slightly reduced pressure compared with atmospheric pressure. However, such a procedure is not considered essential.

The process according to the invention, is particularly suitable for use with elementary semiconductors such as silicon or germanium, and is noteworthy because of an extremely low requirement for and usage of reagents. This is because only the quantities of liquid and gaseous components have to be replaced, which are always removed on changing the batch. Ideally, the composition of the etchant is therefore continuously or periodically monitored analytically. Thus, this composition can be kept within the desired limits or re-established by replenishing components either individually or as a mixture. Owing to the low reagent requirement and usage, the environmental pollution caused by the etching process according to the invention is extremely low.

The invention will now be explained more fully by way of examples which are, however, only given by way of illustration and not of limitation.

EXAMPLE 1

The process was carried out in an apparatus with a design similar to that shown in FIG. 2. Approximately 10 l of etchant (composition approximately 3 moles/l HF, approximately 3.3 moles/l $HNO_3$, approximately 11.5 moles/l $H_2SO_4$, approximately 15 moles/l $H_2O$) were provided in the etchant reservoir which was a cylindrical polytetrafluoroethylene container. This mixture was kept at a temperature of approximately 40° C. Twenty (20) silicon wafers (diameter approximately 7.5 cm, and thickness approximately 500 μm) placed in a processing boat manufactured from polytetrafluoroethylene could be exposed to the action of the etchant in the etching station. This etching station was designed as a spray etching chamber and constructed of the same materials.

The hydrolysis station, likewise manufactured from polytetrafluoroethylene, consisted of a trickle washer which was provided with a condensation attachment. A relatively water-rich sulfuric acid (approximately 30 moles/l $H_2O$, approximately 8.9 moles/l $H_2SO_4$) was circulated in the hydrolysis station by pumping and was at the same time kept at about 140° C. A polytetrafluoroethylene membrane filter was incorporated in the circuit to filter out the solid hydrolysis product $SiO_2$ produced.

Both the regeneration stations in the regeneration zone were likewise designed as trickle washers in which the gas mixtures produced could be fed in countercurrent to the etching mixture for the purpose of absorption. The temperature in the regeneration stations, which were likewise manufactured from polytetrafluoroethylene, was adjusted to approximately 15° C.

During the actual etching process, the etching station was loaded each time with 20 silicon wafers to the specifications mentioned above. These wafers were arranged in a processing boat and were sprayed for approximately 4 minutes via the spray nozzles with the etching mixture circulated by pumping from the etchant reservoir. During this process, on average, approximately 42 $\mu$m (equivalent to the dissolution of a total of approximately 8.4 g of silicon) were etched away. The wafer surfaces obtained were mirror like. The etching rate was, in each case, monitored by random sampling by re-weighing the etched wafers.

The gases produced in the etching process, that is to say, essentially silicon tetrafluoride and nitrous gases, were continuously fed from the etching station to the hydrolysis station by means of a current of air after it had passed through the etchant reservoir. There, the silicon tetrafluoride was hydrolyzed in countercurrent. The $SiO_2$ formed in the liquid phase remained behind and was retained in the filter. The hydrogen fluoride formed was removed with the current of air from the hydrolysis station, together with the nitrous gases already partially reoxidized by means of the atmospheric oxygen.

On passing through the two regeneration stations, the nitrous gases were reoxidized and absorbed, as also was the hydrogen fluoride. Between the first regeneration station and the etchant reservoir, a part of the etchant was at the same time continuously circulated and consequently provision was made for a continuous return of the absorbed reactants to the etching cycle.

After about 5000 etched wafers, the acid mixtures then present in the various stations were always cyclically replaced. Specifically, the acid from the second regeneration station was added to the etchant in the etchant reservoir and replaced by the acid from the hydrolysis station. The latter was in turn loaded with used etchant mixture.

With this procedure, it was possible to etch approximately 6100 wafers before the etching rate had dropped below the limit value of 5 $\mu$m/min which is still regarded as tolerable.

By topping off with approximately 13.2 moles of hydrogen fluoride and approximately 1.2 moles of nitric acid, it was possible to increase the etching rate again to the original value of approximately 10 $\mu$m/min. This corresponds to a regeneration by the cycling process of approximately 96.4% of the hydrogen fluoride and approximately 99% of the nitric acid, in each case based on the starting quantities.

In a comparison experiment, silicon wafers were etched under otherwise identical conditions without the etchant being regenerated. In this case, the etching rate had already sunk to 5 $\mu$m/min after only 220 etched wafers, so that it was necessary to top off with approximately 13.2 moles of hydrogen fluoride and approximately 4.4 moles of $HNO_3$ to again increase the etching rate to approximately 10 $\mu$m/min.

EXAMPLE 2

In the same apparatus, an acid mixture composed of approximately 3 moles/l HF, approximately 3.3 moles/l $HNO_3$, approximately 5.5 moles/l $H_3PO_4$, approximately 5.8 moles/l $H_2SO_4$, and approximately 15.7 moles/l $H_2O$ was used as an etchant under the same process conditions.

At the beginning of the etching process, a mixture consisting of approximately 5.5 moles/l $H_3PO_4$, approximately 5.8 moles/l $H_2SO_4$ and approximately 25 moles/l water was provided in the hydrolysis station. Both regeneration stations were loaded with etchant. As the process began, the etchant had an etching rate of approximately 10.5 $\mu$m/min. Silicon wafers (diameter approximately 7.5 cm, thickness approximately 500 $\mu$m) were again etched. On carrying out the process with circulation and working-up in the manner according to the invention, it was possible to etch approximately 3700 slices before the etching rate had sunk to the 5 $\mu$m/min specified as the predetermined tolerance limit.

Without circulation and working-up, the etching rate of the etchant dropped to below 5 $\mu$m/min after only approximately 220 wafers.

EXAMPLE 3

Using the same procedure described in Example 2, silicon wafers were etched with an etchant composed of approximately 3 mol/l HF, approximately 3.3 moles/l $HNO_3$, approximately 2.3 moles/l $H_3PO_4$, approximately 9.6 moles/l $H_2SO_4$ and approximately 13.7 moles/l $H_2O$. The initial etching rate was approximately 6 $\mu$m/min and the duration of etching approximately 7 minutes.

While the regeneration stations were loaded with etchant at the beginning, an acid mixture composed of approximately 2.3 moles/l $H_3PO_4$, approximately 9.6 moles/l $H_2SO_4$, and approximately 25 moles/l $H_2O$ was provided in the hydrolysis station. If the etchant was circulated and subjected to regeneration, the etching rate had dropped to below 4 $\mu$m/min after approximately 4,400 etched wafers. Without circulation and regeneration, the etching rate was already below this value after approximately 200 etched wafers.

While several embodiments and examples of the present invention have been described, and/or shown, it is obvious that many changes and modifications may be made thereunto without departing from the spirit and scope of the invention.

What is claimed is:

1. A process for etching the surface of an elementary semiconductor by the combined action of an oxidizing agent, which oxidizes the elementary semiconductor and produces an oxidation product, and a dissolving agent which dissolves the oxidation product, comprising the steps of:

contacting said elementary semiconductor with a solution comprising said oxidizing agent and said dissolving agent in an acid carrier medium, said acid carrier medium including a member selected from the group consisting of sulfuric acid, phosphoric acid, phosphorus oxide and combinations thereof, wherein contacting said oxidizing agent with said elementary semiconductor results in the production of an oxidation product and a reduction product, and wherein said dissolving agent dissolves said oxidation product resulting in the production of a dissolution product, supplying oxygen to said solution to reoxidize said reduction product resulting in the reformation of the oxidizing agent, liberating said dissolving agent from said dissolution product and forming a solid reaction product, separating off and removing said solid reaction product and recirculating liberated dissolving agent and reformed oxidizing agent in said acid carrier medium.

2. The process according to claim 1, wherein said oxidizing agent includes nitrogen/oxygen compounds.

3. The process according to claim 1, wherein said dissolving agent is hydrofluoric acid.

4. The process according to claim 1, wherein in said acid carrier medium, up to 90% by weight of phosphoric acid, based upon the sulfuric acid, is added to said acid carrier medium previously containing sulfuric acid.

5. The process according to claim 1, wherein said oxiding agent and said dissolving agent are applied to the elementary semiconductor by spraying.

6. The process according to claim 1, wherein said circulating step is carried out at a pressure below atmospheric pressure.

7. The process according to claim 1, wherein said acid carrier medium is maintained at a temperature of from 20 to 50° C., while acting on the elementary semiconductor.

8. The process according to claim 1, wherein said elementary semiconductor is silicon.

9. The process according to claim 1, wherein said elementary semiconductor is germanium.

* * * * *

UNITED STATES PATENT AND TRADEMARK OFFICE
CERTIFICATE OF CORRECTION

PATENT NO. : 4,971,654
DATED : November 20, 1990
INVENTOR(S) : Anton Schnegg et al It is certified that error appears in the above-identified patent and that said Letters Patent is hereby corrected as shown below:

Cover page, column 1, item [73], lines 1-2, delete the Assignee's name and substitute the following therefor --Wacker-Chemitronic Gesellschaft fur Elektronik-Grundstoffe mbH--.

Signed and Sealed this

Twenty-sixth Day of February, 1991

*Attest:*

HARRY F. MANBECK, JR.

*Attesting Officer*      *Commissioner of Patents and Trademarks*